US011195694B2

United States Patent
Matsumoto et al.

(10) Patent No.: US 11,195,694 B2
(45) Date of Patent: Dec. 7, 2021

(54) CHARGED PARTICLE BEAM SYSTEM, METHOD FOR DETERMINING RANGE FOR AUTOMATICALLY SEARCHING FOR FOCAL POINT POSITION IN CHARGED PARTICLE BEAM DEVICE, AND NON-TRANSITORY STORAGE MEDIUM RECORDING PROGRAM FOR CAUSING COMPUTER SYSTEM TO DETERMINE RANGE FOR AUTOMATICALLY SEARCHING FOR FOCAL POSITION IN CHARGED PARTICLE BEAM DEVICE

(71) Applicant: Hitachi High-Tech Corporation, Tokyo (JP)

(72) Inventors: Kosuke Matsumoto, Tokyo (JP); Takashi Nobuhara, Tokyo (JP); Hirohiko Kitsuki, Tokyo (JP); Kenji Obara, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/096,603

(22) Filed: Nov. 12, 2020

(65) Prior Publication Data

US 2021/0166911 A1    Jun. 3, 2021

(30) Foreign Application Priority Data

Nov. 29, 2019 (JP) .............................. JP2019-216668

(51) Int. Cl.
*H01J 37/28* (2006.01)
*H01J 37/21* (2006.01)

(52) U.S. Cl.
CPC .............. *H01J 37/28* (2013.01); *H01J 37/21* (2013.01); *H01J 2237/216* (2013.01)

(58) Field of Classification Search
CPC .......... H01J 37/00; H01J 37/02; H01J 37/063; H01J 37/12; H01J 37/1477; H01J 37/1472;

(Continued)

(56) References Cited

U.S. PATENT DOCUMENTS

2002/0171051 A1   11/2002  Nakagaki et al.
2005/0194533 A1    9/2005  Okuda et al.

(Continued)

FOREIGN PATENT DOCUMENTS

| JP | 2002-310962 A | 10/2002 |
| JP | 2005-285746 A | 10/2005 |
| JP | 2009-194272 A |  8/2009 |

*Primary Examiner* — Jason L McCormack
(74) *Attorney, Agent, or Firm* — Crowell & Moring LLP

(57) ABSTRACT

The present disclosure provides a technique for reducing man-hour of a user required for setting an automatic focused focal point search function of an electron beam and facilitating observation of a sample when reviewing a defect using an electron microscope. The present disclosure provides a technique in a charged particle beam system, in which an appropriate focal point position search width can be automatically set in consideration of convergence accuracy and an operation time based on a focal point measure distribution width for a focal point position acquired in advance under the same conditions and a difference between focal point positions before and after automatic focused focal point position search.

13 Claims, 10 Drawing Sheets

(58) Field of Classification Search
CPC .......... H01J 37/21; H01J 37/26; H01J 37/261; H01J 37/1474; H01J 37/222; H01J 37/265; H01J 37/28; H01J 37/10; H01J 2237/216; H01J 2237/2817
USPC ............................ 250/306, 307, 311, 396 R
See application file for complete search history.

(56) References Cited

U.S. PATENT DOCUMENTS

| | | |
|---|---|---|
| 2009/0206259 A1 | 8/2009 | Obara et al. |
| 2012/0300056 A1* | 11/2012 | Ban .................. H01J 37/21 348/80 |
| 2013/0235182 A1* | 9/2013 | Ono .................. H04N 7/18 348/80 |
| 2019/0189389 A1* | 6/2019 | Uemura ............. H01J 37/1472 |

* cited by examiner

[FIG. 1]
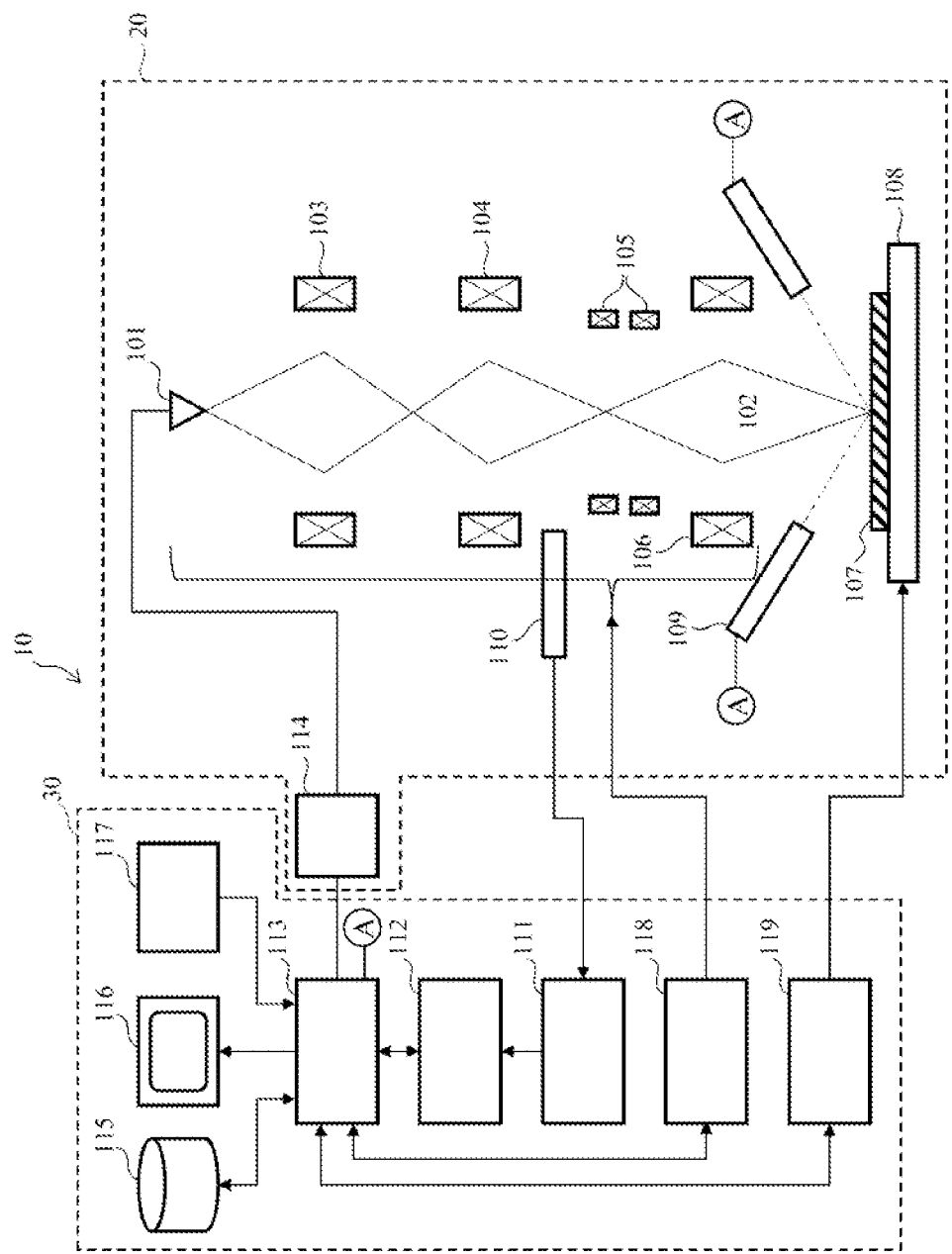

[FIG. 2]
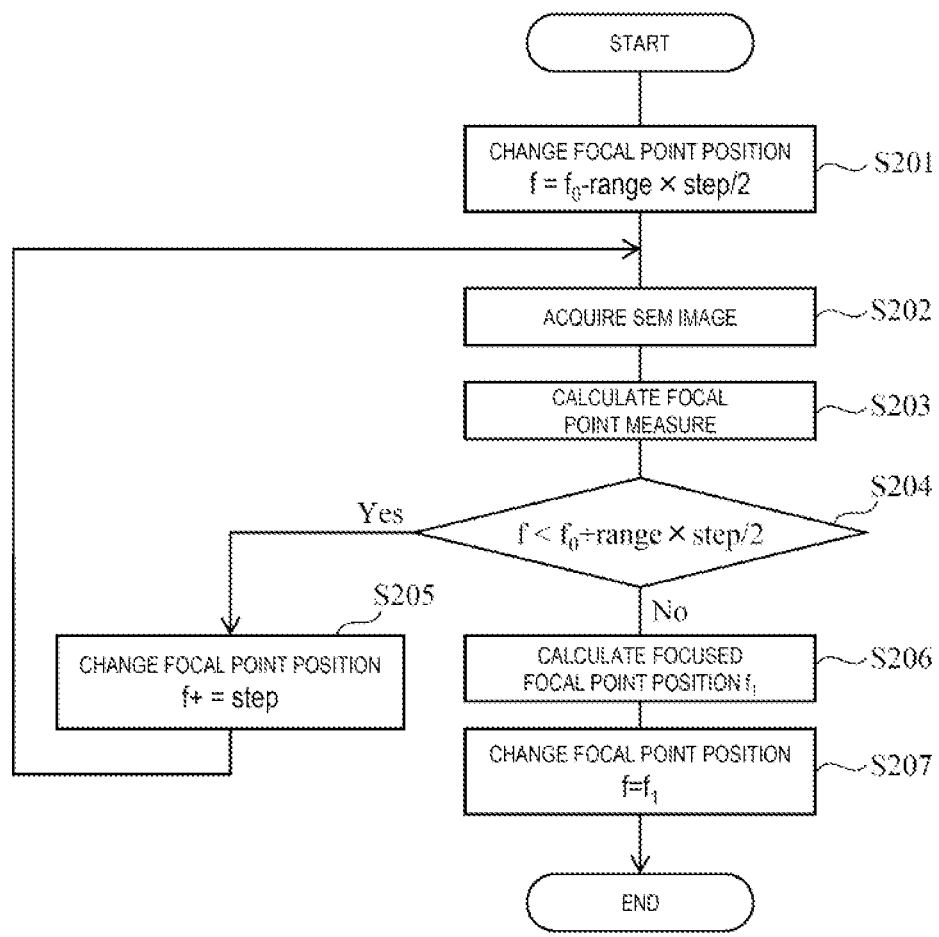

[FIG. 3]
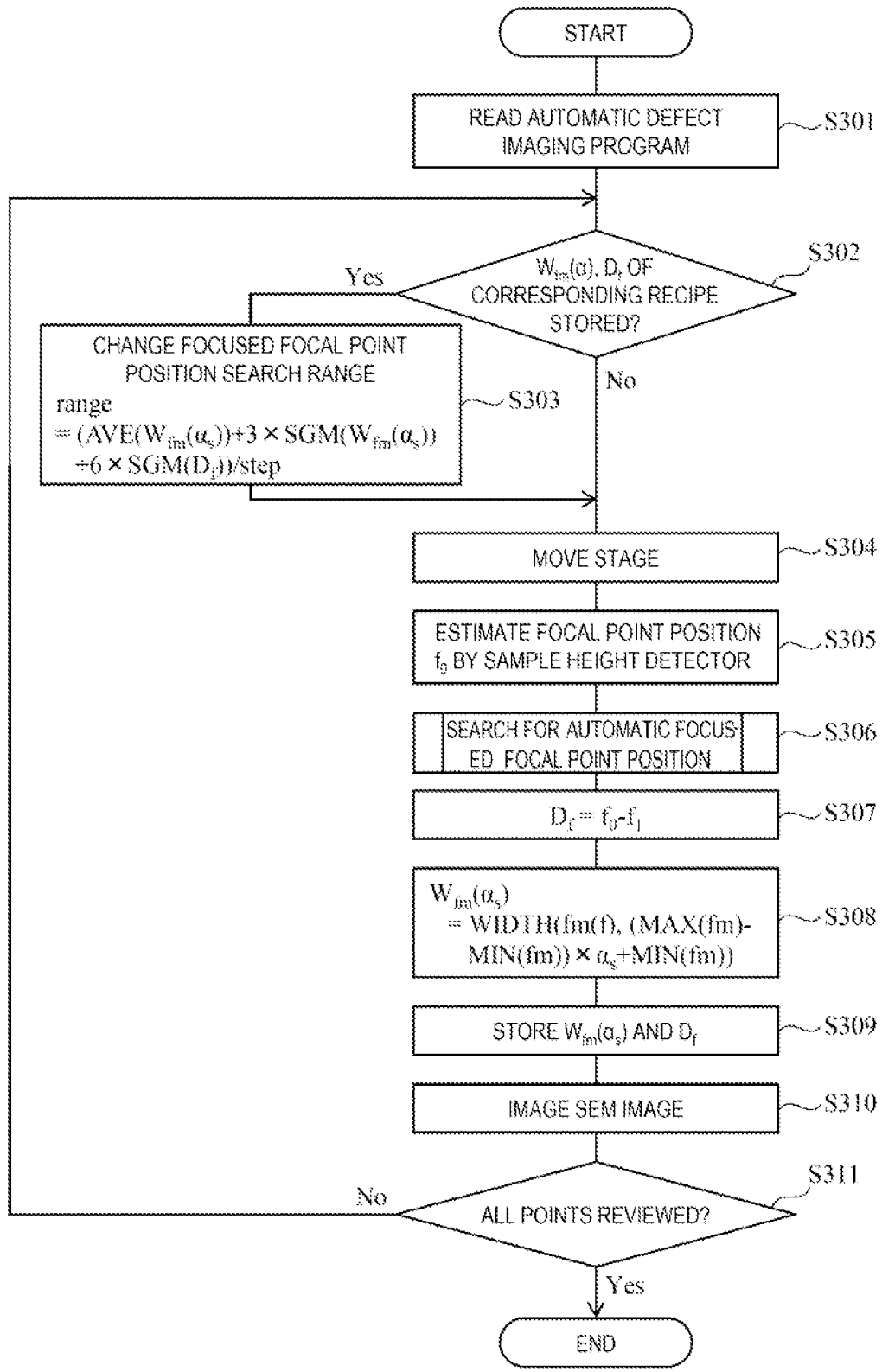

[FIG. 4]
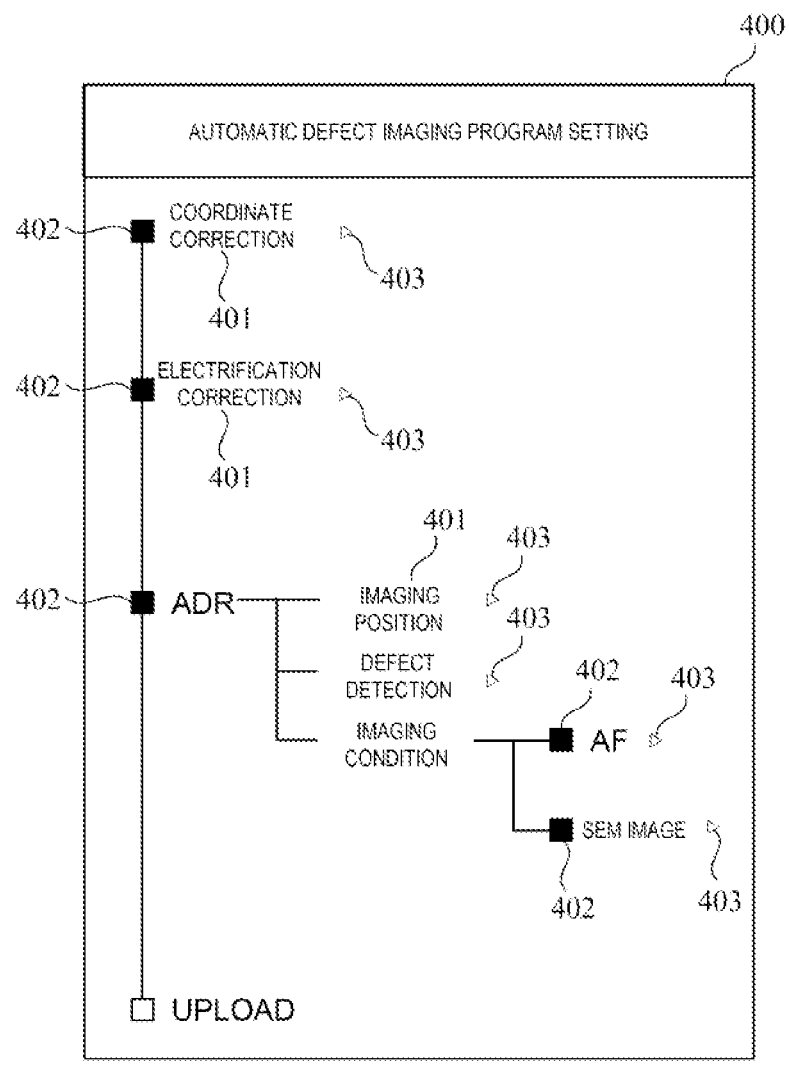

[FIG. 5]
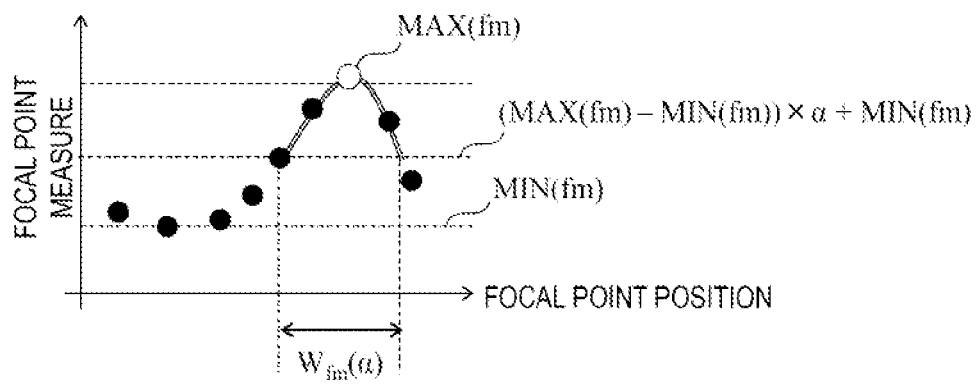
[FIG. 6]
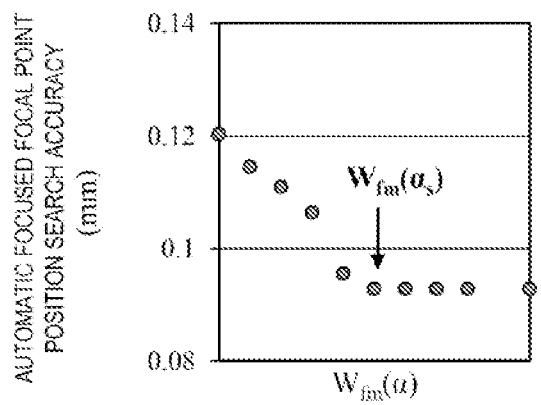

[FIG. 7]
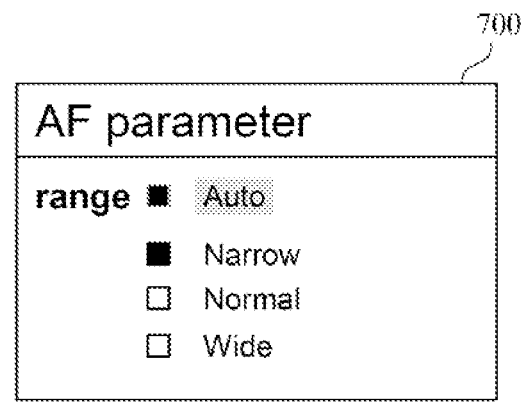
[FIG. 8]
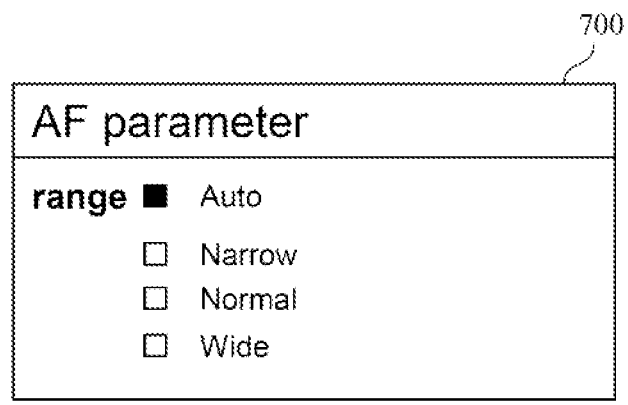

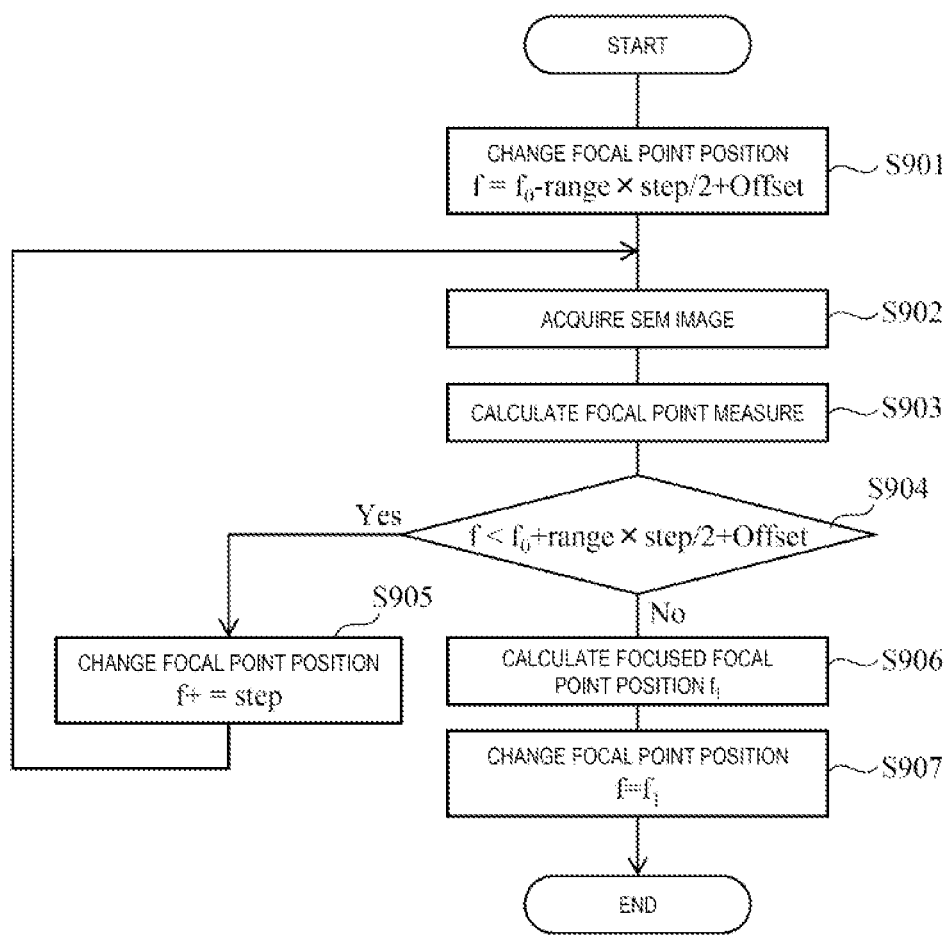
[FIG. 9]

[FIG. 10]
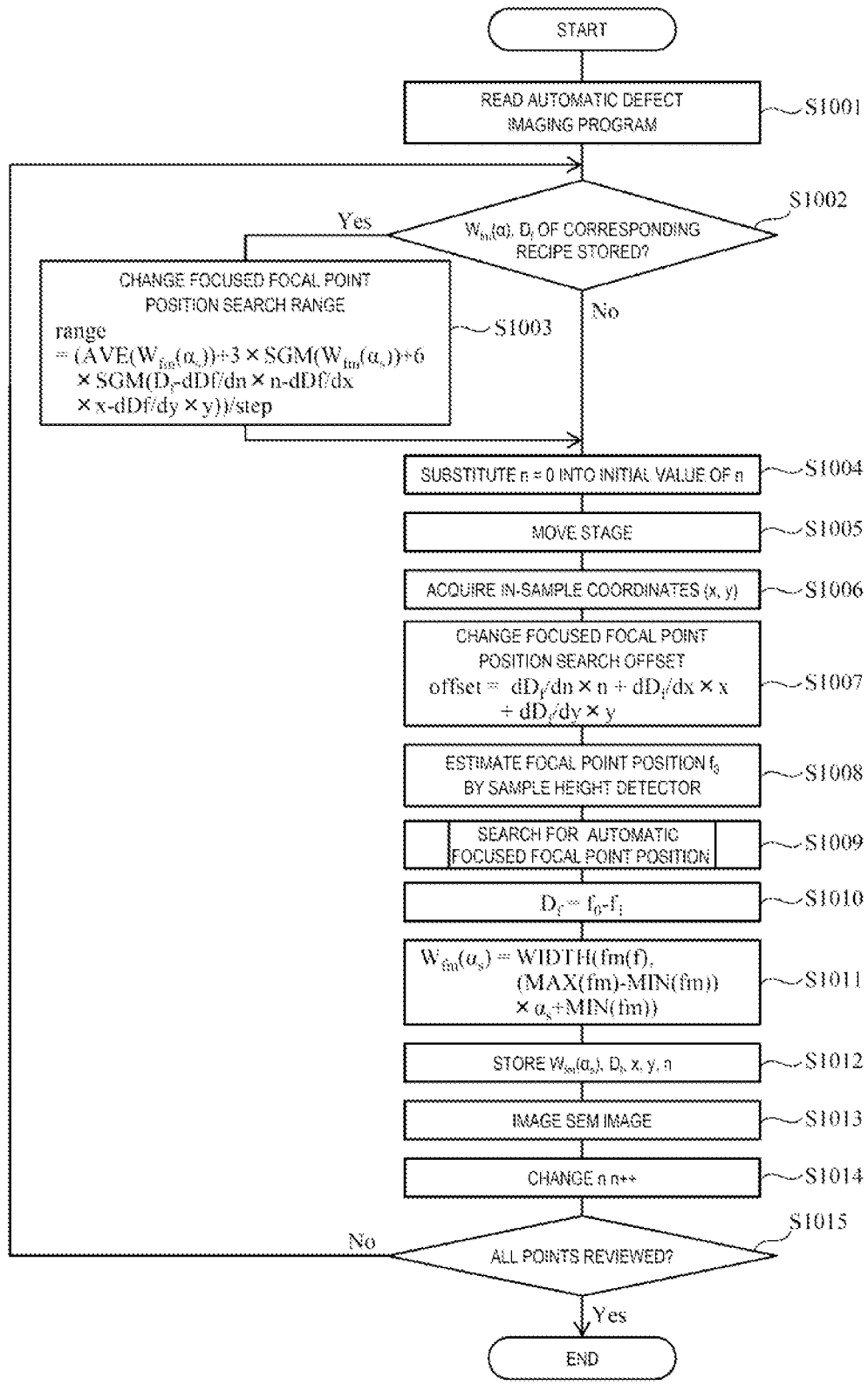

[FIG. 11]
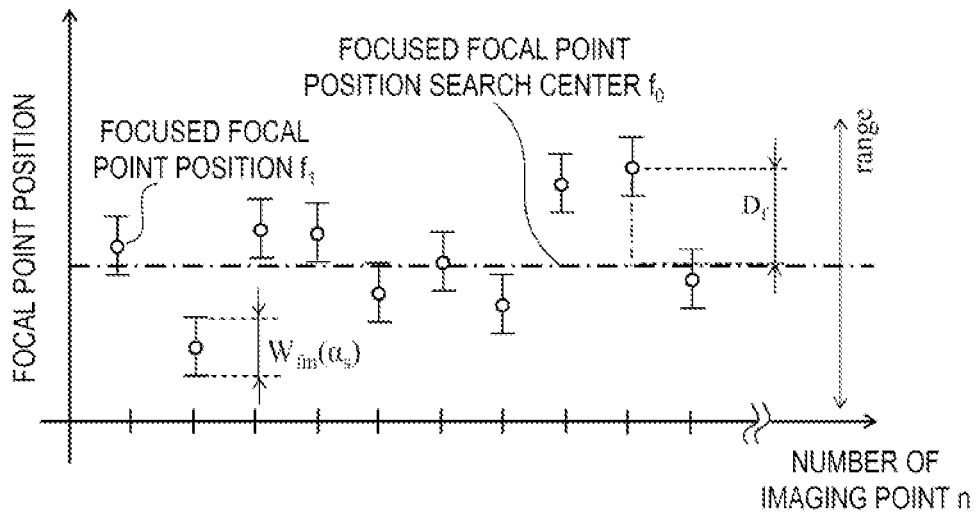
[FIG. 12]
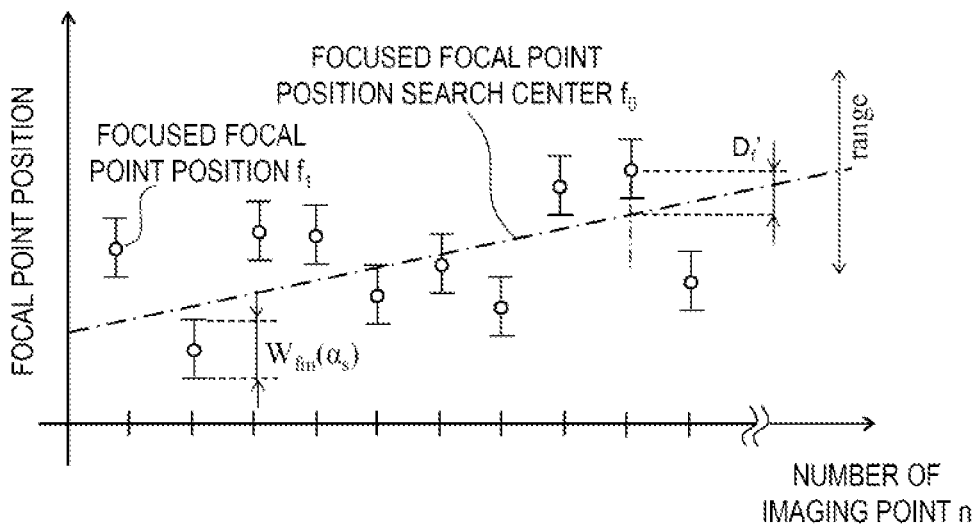

[FIG. 13]
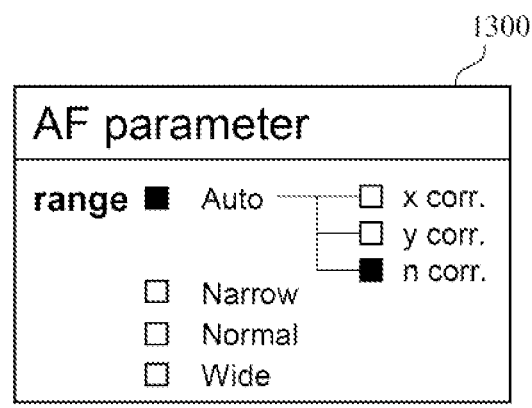

CHARGED PARTICLE BEAM SYSTEM, METHOD FOR DETERMINING RANGE FOR AUTOMATICALLY SEARCHING FOR FOCAL POINT POSITION IN CHARGED PARTICLE BEAM DEVICE, AND NON-TRANSITORY STORAGE MEDIUM RECORDING PROGRAM FOR CAUSING COMPUTER SYSTEM TO DETERMINE RANGE FOR AUTOMATICALLY SEARCHING FOR FOCAL POSITION IN CHARGED PARTICLE BEAM DEVICE

TECHNICAL FIELD

The present invention relates to a charged particle beam system, a method for determining a range for automatically searching for a focal point position in a charged particle beam device, and a non-transitory storage medium recording a program for causing a computer system to determine a range for automatically searching for a focal position in a charged particle beam device.

BACKGROUND ART

A microscope using a charged particle beam as a probe, such as a scanning electron microscope, is used for a purpose of observing a fine structure of a sample in many research and development fields. In a semiconductor device manufacturing process, foreign matters and defects such as disconnection of a wiring pattern may occur on a thin film device due to deficiencies or abnormalities in manufacturing conditions of a processing apparatus. Since these foreign matters and defects have a great influence on performance of the semiconductor device, foreign matter inspection, visual inspection, and the like are monitored for each main process for a purpose of maintaining and improving the yield. An inspection apparatus used for observing the foreign matters and defects in the semiconductor device manufacturing process is referred to as a review SEM.

The review SEM is assumed to be placed in the semiconductor manufacturing process and to operate unattended, and an automatic focused focal point position search function is generally used to obtain an image without focus blur. Accuracy of estimating a focal point position of the automatic focused focal point position search function is directly linked to image quality during defect observation and thus is an important index. On the other hand, in order to reduce a manufacturing cost of the semiconductor devices, it is also required to shorten a processing time of the automatic focused focal point position search function.

The automatic focused focal point position search function is performed as follows, for example.

(i) Acquiring a plurality of images having different focal point positions.

(ii) Digitizing a focus condition of a focal point of each acquired image to calculate a focal point measure.

(iii) Estimating the focal point position where the focal point measure is maximal.

(iv) Setting the focal point position to the value estimated in (iii).

Generally, when the automatic focused focal point position search function is used, it is necessary to set a focused focal point search range indicating a range for changing the focal point position when the images in (i) are acquired.

Depending on a material and structure of an observation target, irradiation of an electron beam may cause an electrification phenomenon on a surface of the observation target, and when the observation target is irradiated with the electron beam again, the electron beam may be affected and a focused focal point may shift. Further, when a height of the observation target varies greatly, it is difficult to focus an electron beam having a shallow depth of a focal point. When the focused focal point position is shift due to such a reason and the focused focal point position is not included in the focused focal point search range, it becomes difficult to accurately estimate the focused focal point position. Therefore, from a viewpoint of stability of the focused focal point position search, it is desirable that the focused focal point position search range is wide. On the other hand, from a viewpoint of shortening a time required for the automatic focused focal point position search, it is desirable that the focused focal point position search range is as narrow as possible. A user needs to set the focused focal point position search range in consideration of these situations, and has to repeat trials to find an appropriate setting.

In order to shorten the processing time of the review SEM, there has been a method that speeds up or eliminates the automatic focused focal point position search function. PTL 1 discloses a method for estimating a focal point position based on a sample height. PTL 2 discloses a method for estimating a focused focal point position by performing an automatic focused focal point position search at a plurality of positions of a sample of an observation target in advance, and creating a map of the focused focal point position of the sample. Further, PTL 3 discloses a method of setting a focused focal point search range based on a shift from the above estimation.

CITATION LIST

Patent Literature

PTL 1: JP-A-2002-310962
PTL 2: JP-A-2005-285746
PTL 3: JP-A-2009-194272

SUMMARY OF INVENTION

Technical Problem

However, according to the technique disclosed in PTL 1, there is a problem that the focused focal point position is only estimated based on the sample height, and thus, the focal point position shifts due to influence of electrification. According to the technique disclosed in PTL 2, there is a problem in that electrification of the sample changes with time during execution of a continuous SEM image imaging program, and the focal point position may shift from the initially created map of the focused focal point position. According to the technique disclosed in PTL 3, since the focal point search range necessary for accurate focused focal point position estimation is not examined, accuracy of a convergence value in the focused focal point position search may deteriorate.

In view of such a situation, the present disclosure provides a technique for reducing man-hour of a user required for setting an automatic focused focal point search function of an electron beam and facilitating observation of a sample when reviewing a defect using an electron microscope.

Solution to Problem

In order to solve above problems, the present embodiment includes a charged particle beam device, and a computer system configured to calculate a focal point measure by digitizing a focus condition of a predetermined focal point position with respect to a sample in the charged particle beam device, and calculate a focused focal point position based on focal point position dependency of the focal point measure. Here, the computer system is configured to execute an automatic focused focal point position search process for determining a focal point position control range for automatic search of the focused focal point position based on a focal point measure distribution width and a focal point position shift, and a process for calculating the focused focal point position within the focal point position control range. Here, the focal point measure distribution width is determined based on focal point position dependency of a focal point measure, and the focal point position shift is calculated based on focal point positions obtained before and after executing the automatic search of the focused focal point position.

Further features relevant to the present disclosure will become apparent from a description of the description and the accompanying drawings. Aspects of the present disclosure may be achieved and implemented by means of the elements and combinations of various elements and the following detailed description and accompanying claims.

The descriptions in this specification are merely exemplary, and are not intended to limit the scope of the claims or application in any way whatsoever.

Advantageous Effect

According to the technique of the present disclosure, it is possible to reduce the number of man-hours required for the user to set parameters for the automatic focused focal point search, and easily observe the sample.

BRIEF DESCRIPTION OF DRAWINGS

FIG. 1 is a diagram showing a cross-sectional configuration example of a scanning electron microscope system 10 according to a present embodiment.

FIG. 2 is a flow chart illustrating details of an automatic focused focal point search process according to a first embodiment.

FIG. 3 is a flowchart illustrating details of an automatic defect imaging process for imaging a defect on a sample (for example, a semiconductor wafer) according to the first embodiment.

FIG. 4 is a diagram showing a schematic configuration example of a setting screen of an automatic defect imaging program.

FIG. 5 is a diagram (graph) illustrating definition of $W_{fm}(\alpha)$.

FIG. 6 is a diagram showing dependency of automatic focused focal point search accuracy on the $W_{fm}(\alpha)$.

FIG. 7 is a diagram (1) showing a configuration example of a setting screen for an automatic focused focal point position search range displayed on a display unit 116.

FIG. 8 is a diagram (2) showing a configuration example of the setting screen for an automatic focused focal point position search range displayed on the display unit 116.

FIG. 9 is a flow chart illustrating details of an automatic focused focal point search process according to a second embodiment.

FIG. 10 is a flow chart illustrating details of an automatic defect imaging process according to the second embodiment.

FIG. 11 is a diagram showing an example (concept) of an automatic focused focal point position search range determined by the first embodiment.

FIG. 12 is a diagram showing an example (concept) of an automatic focused focal point position search range determined by the second embodiment, which corresponds to FIG. 11.

FIG. 13 is a diagram showing a configuration example of an automatic focal point position search range setting screen 1300 according to the second embodiment.

DESCRIPTION OF EMBODIMENTS

The present embodiment discloses a technique for automatically optimizing a focal point position search range of automatic focused focal point position search. Embodiments of the present disclosure will be described below with reference to the accompanying drawings. In the accompanying drawings, functionally the same element may be displayed with the same number. The accompanying drawings show specific embodiments and implementation examples consistent with principles of the present disclosure, and are for the understanding of the present disclosure and are not intended to be construed in a limiting sense.

It is necessary to understand that the present embodiment is described in sufficient detail for those skilled in the art to perform the present disclosure, but other implementations and aspects are possible, and the configuration and the structure can be changed and various elements can be replaced without departing from the scope and the spirit of the technical idea of the present disclosure. Therefore, the following description should not be construed as being limited to the present embodiment.

As will be described later, the embodiments of the invention may be implemented by software running on a general-purpose computer, and may be implemented by dedicated hardware or a combination of software and hardware.

(1) First Embodiment

<Configuration Example of Scanning Electron Microscope>

FIG. 1 is a diagram showing a cross-sectional configuration example of a scanning electron microscope system 10 according to the present embodiment. In the following, the scanning electron microscope will be described as an example, but the same method can be used for another microscope using a charged particle beam such as an ion beam. It is also possible to use a plurality of imaging devices in combination.

The scanning electron microscope system (also referred to as a review SEM system) 10 shown in FIG. 1 includes a scanning electron microscope device 20 and a computer system 30. The scanning electron microscope device 20 includes an electron source 101, a first electron lens 103, a second electron lens 104, a deflector 105, an objective electron lens 106, a sample height detector 109, a sample stage 108, a secondary electron detector 110 and a high voltage power supply 114. The computer system 30 includes an A/D converting unit (A/D converter) 111, an image generating unit (can be configured with a processor) 112, an overall control unit (can be configured with a processor) 113, a storage unit (storage device) 115, a display unit (display device) 116, an input unit (input device) 117, an electronic-optical system control unit (can be configured with a processor) 118, and a stage control unit (can be configured with a processor) 119.

A sample (semiconductor wafer) 107 as an observation target is placed on a sample stage 108 that is movable in XY directions. The sample stage 108 moves based on an instruction signal from the stage control unit 119. The high voltage power supply 114 is connected to the electron source 101, and a voltage is applied to the electron source from the high voltage power supply 114 based on an instruction signal from the overall control unit 113. An electron beam 102 emitted from the electron source 101 is converged by the first electron lens 103, the second electron lens 104, and the objective electron lens 106, and is deflected by the deflector 105 to scan the semiconductor wafer 107.

When the semiconductor wafer 107 is irradiated with the electron beam 102, a secondary electron and a reflected electron are generated from the semiconductor wafer 107. The electron that reaches the secondary electron detector 110 is converted into a current and processed by the A/D converting unit 111. Then, the image generating unit 112 uses data processed by the A/D converting unit 111 to generate an SEM image and perform image processing.

The storage unit 115 and the display unit 116 are connected to the overall control unit 113, and the generated SEM image is stored in the storage unit 115 and displayed on the display unit 116 via the overall control unit 113. A user who uses the review SEM system issues an instruction to the overall control unit 113 through the input unit 117 or inputs an item such as a control condition. The overall control unit 113 issues an instruction to the high voltage power supply 114, the electronic-optical system control unit 118, and the stage control unit 119 based on the user's input and a program recorded in advance, so as to control each part such as changing an imaging condition of the SEM image and changing an imaging position.

Since the scanning electron microscope device (SEM) 20 has a shallow depth of a focal point, the scanning electron microscope device 20 is generally operated to adjust the focal point position before imaging. Before an operation of scanning the semiconductor wafer 107, a surface height of the semiconductor wafer 107 is measured by using the sample height detector 109, a focused focal point position is calculated by the overall control unit 113 based on the surface height, and the focal point position of the electron beam 102 is changed by changing an exciting current of the objective electron lens 106 via the electronic-optical system control unit 118 according to the focused focal point position. The focal point position can be controlled not only by changing the exciting current of the objective electron lens 106 but also by changing other control values such as that of the first electron lens 103 and the second electron lens 104. When a measurement accuracy of the sample height detector 109 is coarser than a depth of a focal point of the electron beam 102, or when the focal point position of the electron beam 102 due to electrification of the semiconductor wafer 107 is different from that without electrification, if necessary, the focal point position is adjusted again by an automatic focused focal point search function.

<Automatic Focused Focal Point Search Process>

FIG. 2 is a flow chart illustrating details of an automatic focused focal point search process. The automatic focused focal point search process is executed in a defect imaging process (see FIG. 3), as described later.

(i) Step 201

Based on a focused focal point position search range (range) and a focal point search step width (step) based on user settings, and a focal point position $f_0$ before the automatic focal point position search process is executed, the overall control unit 113 calculates a focal point position for starting the focused focal point position search, and sets the focal point position to a value calculated by the focal point position control described above. A focal point position f for starting the focused focal point position search is shown in Formula 1.

$$f = f_0 - range \times step/2 \qquad \text{(Formula1)}$$

A method for setting the focused focal point position search range (range) will be described later (see FIG. 3). Further, the focal point position $f_0$ before the automatic focal point position search process is executed is a value (fixed value) measured by the sample height detector 109 before the sample is operated, and the focal point search step width (step) is a value set in advance by the user.

(ii) Step 202

The overall control unit 113 acquires an SEM image generated by the image generating unit 112.

(iii) Step 203

The overall control unit 113 calculates a focal point measure, which is a numerical value of sharpness of the SEM image. The focal point measure can be calculated by performing edge extraction such as a differential filter on the SEM image and then averaging pixel values. Note that other evaluation values such as variations in a luminance value can also be used for calculating the focal point measure.

(iv) Step 204

The overall control unit 113 determines whether or not the focal point position f calculated in Step 203 satisfies $f < f_0 + range \times step/2$. That is, it is determined whether or not the calculated focal point position f reaches an upper limit of the focal point position, that is, $f_0 + range \times step/2$. When the focal point position f satisfies $f < f_0 + range \times step/2$ (Step S204: Yes), the process proceeds to Step S205. On the other hand, when the focal point position f satisfies $f \geq f_0 + range \times step/2$ (Step S204: No), the process proceeds to Step S206.

(v) Step 205

The overall control unit 113 adds the focal point search step width (step) to the focal point position f calculated in step 203, changes the focal point position, and causes the process to proceed to Step 202. Thereafter, processing of Step 203 is repeated.

(vi) Step 206

The overall control unit 113 plots a data set of the focal point position f calculated in Step 203 and the focal point measure of the SEM image at that time, and fits the data set with a Gaussian function or the like, so as to estimate a focused focal point position $f_1$ which is the focal point position where the focal point measure is maximum.

(vii) Step 207

The overall control unit 113 sets the focal point position to $f_1$ obtained by the estimation in Step 206.

<Automatic Defect Imaging Process>

FIG. 3 is a flowchart illustrating details of an automatic defect imaging process for imaging a defect on a sample (for example, a semiconductor wafer).

(i) Step 301

In response to an instruction from a user, the overall control unit 113 reads an automatic defect imaging program stored in advance in the storage unit 115.

Note that the automatic defect imaging program is created based on, for example, settings input by the user via the input unit 117 on an automatic defect imaging program setting screen 400 (see FIG. 4) displayed on the display unit 116. The automatic defect imaging program setting screen 400 is provided with characters 401 indicating each sequence and check boxes 402 for designating whether or not each sequence is to be executed. Then, the screen, on which an execution condition of each sequence is set by the user designating a mark 403 provided on a right side of the characters indicating each sequence, can be displayed.

(ii) Step 302

The overall control unit 113 determines whether or not a focal point measure distribution width $W_{fm}(\alpha_s)$ and a focal point position shift $D_f$, which will be described later, are stored in association with the program. When the focal point measure distribution width $W_{fm}(\alpha_s)$ and the focal point position shift $D_f$ are stored (Step 302: Yes), the process proceeds to Step 303. On the other hand, when the focal point measure distribution width $W_{fm}(\alpha_s)$ and the focal point position shift $D_f$ are not stored (Step 302: No, for example, when ($W_{fm}(\alpha_s)$ and $D_f$ for executing a first automatic defect imaging process are not acquired)), the process proceeds to Step 304.

In the present embodiment, for example, since the focal point measure distribution width $W_{fm}(\alpha_s)$ and the focal point position shift $D_f$ are not stored when the first automatic defect imaging process is executed, the process proceeds to Step 304 without proceeding to Step 303 (that is, the focused focal point search range (range) is not set at the first time), but when the focal point measure distribution width $W_{fm}(\alpha_s)$ and the focal point position shift $D_f$ are not stored, the focused focal point search range (range) may be set by using a predetermined default value.

(iii) Step 303

The overall control unit 113 sets a value of the focused focal point search range (range) according to Formula 2.

range=(AVE($W_{fm}(\alpha_s)$)+3×SGM($W_{fm}(\alpha_s)$)+6×SGM($D_f$))/step (Formula 2)

In Formula 2, AVE(x) is an average value of data x, and SGM(x) is a standard deviation of data x.

FIG. 5 is a diagram (graph) illustrating definition of $W_{fm}(\alpha)$. $W_{fm}(\alpha)$ indicates a width of a peak when focal point position dependency of the focal point measure is plotted (a width required for fitting (width required for the sample) obtained from focal point position dependency of the focal point measure when a previous autofocus was executed). Further, $D_f$ indicates a shift of a convergence value before and after the search of the automatic focused focal point position search. $W_{fm}(\alpha)$ can be defined by the following Formula 3 by a maximum value MAX (fm) and a minimum value MIN(fm) of a focal point measure (fm) plot with respect to the focal point position f, and a coefficient ($\alpha$).

$W_{fm}(\alpha)$=WIDTH($fm(f)$,(MAX($fm$)−MIN($fm$))×α+MIN($fm$)) (Formula 3)

Here, WIDTH(x, y) indicates a plot width at a height y of a function x.

FIG. 6 shows dependency of automatic focused focal point search accuracy on $W_{fm}(\alpha)$. The automatic focused focal point search accuracy decreases as $W_{fm}(\alpha)$ increases, but a decreasing degree thereof slows down and becomes constant as $W_{fm}(\alpha)$ increases. That is, it can be seen that an accuracy of the convergence value of the autofocus (vertical axis) improves as the search range is expanded, but converges when the search range exceeds a certain range. Then, $W_{fm}(\alpha_s)$, which is the minimum $W_{fm}(\alpha)$ at which the accuracy starts to increase, can be uniquely obtained by adding a threshold value to an intersection of two approximate lines or a point at which the accuracy is minimum. By obtaining $W_{fm}(\alpha_s)$ in this way, the focused focal point search range (range) can be optimized, and a focal point search time can be shortened.

(iv) Step 304

The overall control unit 113 controls a stage position, so that a target defect is within a visual field of the SEM image.

(v) Step 305

The overall control unit 113 instructs the sample height detector 109 to detect a height of the sample 107. In response to the instruction from the overall control unit 113, the sample height detector 109 detects the height of the sample 107 (estimates the focal point position $f_0$), and transfers the focal point position $f_0$ to the overall control unit 113.

(vi) Step 306

The overall control unit 113 executes the automatic focused focal point position search process shown in FIG. 2 with the focal point position $f_0$ as a reference.

(vii) Step 307

The overall control unit 113 uses a result of the automatic focused focal point position search calculated in step 306 (the automatic focused focal point position search process of FIG. 2) to calculate the difference $D_f$ between the focal point position $f_0$ before the automatic focused focal point search and a convergence value $f_1$ of the automatic focused focal point position search.

(viii) Step 308

The overall control unit 113 uses the result of the automatic focused focal point position search to calculate the focal point measure distribution width $W_{fm}(\alpha_s)$ according to the above Formula 3.

(ix) Step 309

The overall control unit 113 associates with the executed program, so as to store the focal point measure distribution width $W_{fm}(\alpha_s)$ and the focal point position shift $D_f$ in the storage unit 115.

(x) Step 310

The overall control unit 113 executes imaging of the SEM image after the focal point is adjusted.

(xi) Step 311

The overall control unit 113 repeats the processing from Step 302 to Step 310 until all the defect information held in the program is imaged.

<Configuration Example of Setting Screen of Automatic Focused Focal Point Position Search Range>

FIG. 7 is a diagram showing a configuration example of a setting screen for an automatic focused focal point position search range displayed on a display unit 116. An automatic focused focal point position search range setting screen 700 can be displayed by designating the mark on the right side of "AF" indicating the automatic focused focal point position search in FIG. 4. At an upper portion of the automatic focused focal point position search range setting screen 700, "AF Parameter" indicating a setting screen for the automatic focused focal point position search is displayed, and on a right side of the display showing a parameter "range" that defines the focused focal point position search range, four selections "Auto", "Narrow", "Normal", and "Wide", and check boxes next to each selection are provided, such that the user can designate the "range". When "Narrow", "Normal", or "Wide" is designated, a possible fixed value can be set in advance as the focused focal point position search range.

When "Auto" is set, the focused focal point position search range can be set based on the definition formula of the focused focal point position search range shown in the above Formula 3. "Narrow" has a narrow search range, "Wide" has a wide search range, and "Normal" has a search range in between, so that the user can determine the focused focal point position search range based on a type of an observation sample and a time required for observation. Here, the search range being "Normal" means that when looking at a profile of the focal point position and a focal point evaluation value of a certain sample (standard sample), a peak peripheral portion of the profile has a sufficient width for a fitting process to obtain the focal point position. "Wide" means that the search range is wider than "Normal", and "Narrow" means that the search range is narrower than "Normal".

When $D_f$ and $W_{fm}(\alpha_s)$ are not stored in association with the program being edited (Step 302: No), as shown in FIG. 7, a button "Auto" in the focused focal point position search range is in a shaded state indicating that execution is not possible (one example: alternatively, the characters "Auto" may be displayed in thin letters or in a different color). When the "Auto" is selected in the state where the "Auto" cannot be executed, the focused focal point position search range can be set when the program is first executed from other selections. Since the focused focal point position search range when the program is first executed cannot be obtained by Formula 2, the user sets a fixed value according to sample conditions. A fixed focal point position search range can also be set without the user inputting a fixed value.

When $D_f$ and $W_{fm}(\alpha_s)$ are stored in association with the program being edited (Step 301: Yes), as shown in FIG. 8, the button "Auto" in the focused focal point position search range has a dark color indicating that the "Auto" is executable (the shaded state is canceled).

$W_{fm}(\alpha_s)$ and $D_f$ stored in association with the program may be in a state holding information when the same program was previously executed, or may use a result of executing the automatic focused focal point position search at several points on the wafer in advance.

According to the present embodiment, the number of man-hours of the user involved in setting the focused focal point position search range can be reduced, a focused focal point position search time can be minimized, and sample observation can be performed stably.

(2) Second Embodiment

The second embodiment is different from the first embodiment in that an offset is given to the focused focal point search position based on a statistical amount of the focused focal point position acquired in advance. A basic device/system configuration is the same as that shown in FIG. 1. Therefore, the description of the overlapping portions will be omitted, and the constituent elements of FIG. 1 will be cited and described as necessary.

<Automatic Focused Focal Point Search Process>

FIG. 9 is a flow chart illustrating details of an automatic focused focal point search process according to a second embodiment. The automatic focused focal point search process is executed in a defect imaging process (see FIG. 10), as described later. The automatic focused focal point search process of FIG. 9 is different from the automatic focused focal point search process of FIG. 2 in Step 901 and Step 906. The other steps are the same as those in the first embodiment. That is, in the second embodiment, when the focal point position is changed (step 901), the focal point position to be changed to is different, and an offset value depending on the number of imaging points and imaging coordinates is added. The offset is calculated according to the following Formula 4 by $D_f$ acquired in advance.

$$\text{offset}=dD_f/dn\times n+dD_f/dx\times x+dD_f/dy\times y \quad \text{(Formula 4)}$$

Here, n represents the number of imaging points in the automatic defect imaging program, and x, y respectively represent an x coordinate and a y coordinate on the sample.

A reason for adding the offset is to set an optimum focused focal point search range corresponding to the change over time of the electrification on the sample 107.

<Automatic Defect Imaging Process>

FIG. 10 is a flowchart illustrating details of an automatic defect imaging process according to the second embodiment. In the automatic defect imaging process according to the second embodiment, before an estimation process of the focal point position $f_0$ performed by the sample height detector 109 (Step 1008: equivalent to Step 305), a focused focal point position offset change process (Step 1007) is executed. Further, in order to acquire x, y, n necessary for calculating the focused focal point position offset, an n initial value substitution process (Step 1004) before a stage movement process (Step 1005: equivalent to Step 304), an in-sample coordinate (x, y) acquisition process (Step 1006) after the stage movement process (Step 1005), and an n change process (Step 1014) after an SEM image imaging process (Step 1013: Step 310) are executed.

After an automatic focused focal point position search process (Step 1009), a $D_f$ calculation process (Step 1010), and a $W_{fm}(\alpha_s)$ calculation process (Step 1011), the overall control unit 113 associates with the program, so as to store $W_{fm}(\alpha_s)$, $D_f$, x, y, n in an internal memory thereof (not shown) or the storage unit 115.

<Configuration Example of Setting Screen of Automatic Focal Point Position Search Range>

FIG. 13 is a diagram showing a configuration example of an automatic focal point position search range setting screen 1300 according to the second embodiment.

By the user designating the mark on the right side of "AF" indicating the automatic focused focal point position search on the automatic defect imaging program setting screen 400 shown in FIG. 4 displayed by the display unit 116, an automatic focal point position search range setting screen 1300 in FIG. 13 can be displayed.

At an upper portion of the automatic focal point position search range setting screen 1300, "AF Parameter" indicating a parameter setting of the automatic focused focal point position search is displayed, and the user can select "range" from "Auto", "Narrow", "Normal", and "Wide". At a right side of "Auto", characters "x corr.", "y corr.", and "n corr." that indicate x correction, y correction, and n correction are displayed, and the Offset according to the above Formula 4 is calculated with these selections. When "x corr." is not selected, the second term of Formula 4 becomes 0, when "y corr." is not selected, the third term of Formula 4 becomes 0, and when "n corr." is not selected, the first term of Formula 3 becomes 0. That is, when all of "x corr.", "y corr.", and "n corr." are not selected, Formula 4 becomes 0, and a value of the range has the same result as Formula 2 shown in the first embodiment. Since an automatic defect imaging program having a small number of points cannot acquire an accurate tendency of $D_f$ with respect to n, the user can ignore the tendency with respect to n by not selecting "n corr.". When the automatic defect imaging program has a narrow distribution of imaging positions, the user can ignore the tendency with respect to the x coordinate and the y coordinate by not selecting "x corr." or "y corr.". A threshold for the number of points of the automatic defect imaging program or distribution of the x coordinate and they coordinate may be provided, so that the selection of "x corr.", "y corr.", and "n corr." can be automatically set without a need for user selection.

<Comparative Example of Automatic Focused Focal Point Position Search Range>

FIG. 11 is a diagram showing an example (concept) of an automatic focused focal point position search range determined by the first embodiment. FIG. 12 is a diagram showing an example (concept) of an automatic focused focal point position search range determined by the second embodiment, which corresponds to FIG. 11.

FIG. 12 shows $D_f'=D_f-dD_f/dn \times n$. According to the second embodiment, since the offset depending on the number of imaging points n is added to the focused focal point position search center $f_0$, the focused focal point position search range (range) can be set narrower than that of the first embodiment. In FIGS. 11 and 12, for simplicity of explanation, only the dependency of $D_f$ on the number of imaging points n is described, but with respect to x and y, the focused focal point position search range (range) can be set narrower similarly.

When the second embodiment is applied, in observation of a sample in which the focal point search range must be widened due to progress electrification during imaging, the focal point search range can also be optimized without requiring the knowledge and effort of the user.

(3) Overview (i) The present embodiment executes the process of determining the focal point position control range for automatic search of the focused focal point position based on the focal point measure distribution width $W_{fm}(\alpha_s)$ and the focal point position shift $D_f$, and calculating the focused focal point position within the determined focal point position control range. At this time, as the focal point measure distribution width, it is possible to use a default value (for example, a predetermined initial value) or a value determined based on the focal point position dependency of the focal point measure obtained by executing the imaging process of the defect image. Further, the focal point position shift is calculated based on the focal point positions obtained before and after performing the automatic search for the focused focal point position (which can be calculated based on the difference between the focused focal point position $f_1$ obtained by the previous defect imaging process and the focused focal point position $f_0$ (including the focused focal point position obtained by the sample height detector 109) obtained by the further previous defect imaging process). In this manner, an appropriate focal point position control range can be automatically set. Therefore, without necessarily searching an excessive range, the time required to search for the focused focal point position can be shortened, and meanwhile, it becomes possible to reduce the number of man-hours for parameter setting related to the focused focal point search by the user.

Further, in the present embodiment, the current focal point position control range is determined by using the focal point measure distribution width and the focal point position shift obtained by the previous automatic focused focal point position search process. Since the data of the focal point measure distribution width and the data of the focal point position shift obtained by the previous automatic focused focal point position search process is recorded in the storage unit 115 in association with the defect imaging program for acquiring the defect image of the sample, the values thereof are read and used for the current process. Since the focal point position control range is determined by using the parameter values obtained by the latest process, the process can be optimized easily, and the time required for the focused focal point position search can be shortened.

Specifically, the focal point position control range is determined according to the following Formula 2 (Formula 1 in the claims).

$$\text{range} = (\text{AVE}(W_{fm}(\alpha_s)) + 3 \times \text{SGM}(W_{fm}(\alpha_s)) + 6 \times \text{SGM}(D_f))/\text{step} \quad \text{(Formula 2)}$$

Here, range represents the focal point position control range, $W_{fm}(\alpha_s)$ represents the focal point measure distribution width represented by the following Formula 3 (Formula 2 in claims), SGM represents the standard deviation, $D_f$ represents the focal point position shift, and step represents a preset focal point search step width.

$$W_{fm}(\alpha) = \text{WIDTH}(fm(f), (\text{MAX}(fm) - \text{MIN}(fm)) \times \alpha + \text{MIN}(fm)) \quad \text{(Formula 3)}$$

Here, WIDTH(x, y) indicates a plot width at a height y of a function x, fm represents the focal point measure, MAX (fm) represents the maximum value of fm, MIN (fm) represents the minimum value of fm, and $\alpha$ represents a coefficient.

In the second embodiment, the offset value, which uses the state of electrification of the sample as an element for determining the focal point position control range, is further calculated based on the focal point position shift $D_f$ which is a function of the number of imaging points and the coordinates (x, y) of each imaging point. Then, the focal point position control range is determined based on the offset value, the focal point measure distribution width, and the focal point position shift. Since the offset value is considered in this way, an appropriate focal point position control range can be set according to the state of the sample in which the electrification is accumulated while executing the defect imaging process, and the time required to search for the focused focal point position can be further shortened.

Specifically, the offset value is calculated according to the following Formula 4 (Formula 3 in claims), and the focal point position control range is determined according to the following Formula 5 (see Step 1003 of FIG. 10: Formula 4 in the claims).

$$\text{offset} = dD_f/dn \times n + dD_f/dx \times x + dD_f/dy \times y \quad \text{(Formula 4)}$$

$$\text{range} = (\text{AVE}(W_{fm}(\alpha_s)) + 3 \times \text{SGM}(W_{fm}(\alpha_s)) + 6 \times \text{SGM}(D_f, \text{offset}))/\text{step} \quad \text{(Formula 5)}$$

Here, offset represents the offset value, $D_f$ represents the focal point position shift, range represents the focal point position control range, $W_{fm}(\alpha_s)$ represents the focal point measure distribution width represented by the following Formula 5, SGM represents the standard deviation, and step represents the preset focal point search step width.

$$W_{fm}(\alpha) = \text{WIDTH}(fm(f), (\text{MAX}(fm) - \text{MIN}(fm)) \times \alpha + \text{MIN}(fm)) \quad \text{(Formula 2)}$$

Here, WIDTH(x, y) indicates a plot width at a height y of a function x, fm represents the focal point measure, MAX (fm) represents the maximum value of fm, MIN (fm) represents the minimum value of fm, and $\alpha$ represents a coefficient.

Further, in the second embodiment, a setting screen that allows selection of the element to be considered as the offset value among the number of imaging points, the x-coordinate of the imaging point, and the y-coordinate of the imaging point may be displayed on a display screen of the display unit 116 as a GUI. In this case, the offset value is calculated based on the selection content input from the setting screen.

(ii) Functions of the embodiments according to the present disclosure can be implemented by a program code of software. In this case, a storage medium recording a program code is provided to the system or the device, and a computer (or CPU or MPU) of the system or the device reads the program code stored in the storage medium. In this case, the program code itself read from the storage medium implements functions of the above embodiments, and the program code itself and the storage medium storing the program code constitute the present disclosure. As the storage medium to supply such a program cord, for example, a flexible disk, a CD-ROM, a DVD-ROM, a hard disk, an optical disk, a magneto-optical disk, a CD-R, a magnetic tape, a nonvolatile memory card, or a ROM may be used.

An operating system (OS) or the like running on the computer may perform a part or all an actual process based on an instruction of the program cord, and the functions of the above embodiments may be implemented by the processing. After the program code read from the storage medium is written in a memory of the computer, the CPU or the like of the computer may perform a part or all of the actual processing based on the instruction of the program code, and the functions of the above embodiments may be implemented by the processing.

Further, by distributing the program cord of software for implementation of the functions of the embodiment via a network, the program cord may be stored in a storage device such as a hard disk or a memory of the system or the device or in a storage medium such as a CD-RW or a CD-R, and may be executed by reading the program cord stored in the storage device or the storage medium by the computer (or the CPU or the MPU) of the system or the device during usage.

Finally, it is necessary to understand that processes and techniques described herein are not inherently relevant to any particular device and that any suitable combination of components may be implemented. Further, various types of devices for general purpose may be used in accordance with teachings described herein. It may be appreciated that it is beneficial to construct a specialized device to execute the steps of the method described herein. In addition, various inventions can be formed by appropriately combining a plurality of the constituent elements disclosed in the embodiments. For example, some constituent elements may be deleted from all the constituent elements disclosed in the embodiments. Further, the components in different embodiments may be appropriately combined. As described above, the present disclosure has been described with reference to specific examples, which are for illustrative purposes only and not for purposes of limitation. Those skilled in the art will recognize that there are numerous combinations of hardware, software, and firmware that are suitable for practicing the present disclosure. For example, described software may be implemented in a wide range of programs or scripting languages such as an assembler, C/C++, perl, Shell, PHP, and Java (registered trademark).

Further, in the above embodiments, a control line and an information line are considered to be necessary for description, and all control lines and information lines are not necessarily shown in a product. All of the configurations may be connected to each other.

In addition, other implementations of the present disclosure will be apparent to those of ordinary skill in the art from consideration of the specification and embodiments of the present disclosure disclosed herein. The various aspects and/or components of the described embodiments can be used alone or in any combination. It is intended that the description and the specific examples be considered as exemplary only, with a scope and a spirit of the disclosure being indicated by the following claims.

REFERENCE SIGN LIST 10 scanning electron microscope system (review SEM system)
20 scanning electron microscope device
30 computer system
101 electron source
102 electron beam
103 first electron lens
104 second electron lens
105 deflector
106 objective electron lens
107 sample
108 sample stage
109 sample height detector
110 secondary electron detector
111 A/D converting unit
112 image generating unit
113 overall control unit
114 high voltage power supply
115 storage unit
116 display unit
117 input unit
118 electronic-optical system control unit
119 stage control unit

The invention claimed is:
1. A charged particle beam system, comprising:
a charged particle beam device; and
a computer system configured to calculate a focal point measure by digitizing a focus condition of a predetermined focal point position with respect to a sample in the charged particle beam device, and calculate a focused focal point position based on focal point position dependency of the focal point measure, wherein
the computer system is configured to execute
an automatic focused focal point position search process for determining a focal point position control range for automatic search of the focused focal point position based on a focal point measure distribution width and a focal point position shift, and
a process for calculating the focused focal point position within the focal point position control range,
the focal point measure distribution width is determined based on the focal point position dependency of the focal point measure, and
the focal point position shift is calculated based on focal point positions obtained before and after executing the automatic search of the focused focal point position.
2. The charged particle beam system according to claim 1, wherein
the computer system is configured to determine a current focal point position control range by using the focal point measure distribution width and the focal point position shift obtained by a previous automatic focused focal point position search process, and
data of the focal point measure distribution width and data of the focal point position shift obtained by the previous automatic focused focal point position search process are associated with a defect imaging program for acquiring a defect image of the sample, thereby recorded in a storage unit.

3. The charged particle beam system according to claim 1, wherein
the computer system is configured to determine the focal point position control range according to the following Formula 1:

$$\text{range}=(\text{AVE}(W_{fm}(\alpha_s))+3\times\text{SGM}(W_{fm}(\alpha_s))+6\times\text{SGM}(D_f))/\text{step} \quad \text{(Formula 1)}$$

where range represents the focal point position control range, $W_{fm}(\alpha_s)$ represents the focal point measure distribution width represented by the following Formula 2, SGM represents a standard deviation, $D_f$ represents the focal point position shift, and step represents a preset focal point search step width:

$$W_{fm}(\alpha)=\text{WIDTH}(fm(f),(\text{MAX}(fm)-\text{MIN}(fm))\times\alpha+\text{MIN}(fm)) \quad \text{(Formula 2)}$$

where WIDTH(x, y) indicates a plot width at a height y of a function x, fm represents the focal point measure, MAX(fm) represents a maximum value of fm, MIN(fm) represents a minimum value of fm, and α represents a coefficient.

4. The charged particle beam system according to claim 1, wherein
the computer system is further configured to calculate an offset value, which uses a state of electrification with respect to the sample as an element for determining the focal point position control range, based on the number of imaging points and the focal point shift which is a function of coordinates (x, y) of each imaging point, and determine the focal point position control range based on the offset value, the focal point measure distribution width, and the focal point position shift.

5. The charged particle beam system according to claim 4, wherein
the computer system is configured to calculate the offset value according to the following Formula 3, and determine the focal point position control range according to the following Formula 4:

$$\text{offset}=dD_f/dn\times n+dD_f/dx\times x+dD_f/dy\times y \quad \text{(Formula 3)}$$

$$\text{range}=(\text{AVE}(W_{fm}(\alpha_s))+3\times\text{SGM}(W_{fm}(\alpha_s))+6\times\text{SGM}(D_f\text{-offset}))/\text{step} \quad \text{(Formula 4)}$$

where offset represents the offset value, $D_f$ represents the focal point position shift, range represents the focal point position control range, $W_{fm}(\alpha_s)$ represents the focal point measure distribution width represented by the following Formula 2, SGM represents a standard deviation, and step represents a preset focal point search step width:

$$W_{fm}(\alpha)=\text{WIDTH}(fm(f),(\text{MAX}(fm)-\text{MIN}(fm))\times\alpha+\text{MIN}(fm)) \quad \text{(Formula 2)}$$

where WIDTH(x, y) represents a plot width at a height y of a function x, fm represents a focal point measure, MAX(fm) represents a maximum value of fm, MIN(fm) represents a minimum value of fm, and α represents a coefficient.

6. The charged particle beam system according to claim 5, wherein
the computer system is configured to generate a setting screen that allows selection of an element to be considered as the offset value among the number of imaging points, an x-coordinate of the imaging point, and a y-coordinate of the imaging point, display the setting screen on a display screen of a display unit, and calculate the offset value based on a selection content input from the setting screen.

7. A method for determining a range for automatically searching for a focal point position in a charged particle beam device, the method comprising:
a step of causing a computer system to calculate a focal point measure by digitizing a focus condition of a predetermined focal point position with respect to a sample to;
a step of causing the computer system to determine a focal point measure distribution width based on focal point position dependency of the focal point measure;
a step of causing the computer system to calculate a focal point position shift based on focal point positions obtained before and after executing automatic search for a focused focal point position;
a step of causing the computer system to determine a focal point position control range for the automatic search of the focused focal point position based on the focal point measure distribution width and the focal point position shift; and
a step of causing the computer system to calculate the focused focal point position within the focal point position control range.

8. The method according to claim 7, wherein
the computer system determines a current focal point position control range by using the focal point measure distribution width and the focal point position shift obtained by a previous automatic focused focal point position search process, and
data of the focal point measure distribution width and data of the focal point position shift obtained by the previous automatic focused focal point position search process are associated with a defect imaging program for acquiring a defect image of the sample, thereby recorded in a storage unit.

9. The method according to claim 7, wherein
the computer system determines the focal point position control range according to the following Formula 1:

$$\text{range}=(\text{AVE}(W_{fm}(\alpha_s))+3\times\text{SGM}(W_{fm}(\alpha_s))+6\times\text{SGM}(D_f))/\text{step} \quad \text{(Formula 1)}$$

where range represents the focal point position control range, $W_{fm}(\alpha_s)$ represents the focal point measure distribution width represented by the following Formula 2, SGM represents standard deviation, $D_f$ represents the focal point position shift, and step represents a preset focal point search step width:

$$W_{fm}(\alpha)=\text{WIDTH}(fm(f),(\text{MAX}(fm)-\text{MIN}(fm))\times\alpha+\text{MIN}(fm)) \quad \text{(Formula 2)}$$

where WIDTH(x, y) represents a plot width at a height y of a function x, fm represents focal point measure, MAX(fm) represents a maximum value of fm, MIN(fm) represents a minimum value of fm, and α represents a coefficient.

10. The method according to claim 7, wherein
the computer system further calculates an offset value, which uses a state of electrification with respect to the sample as an element for determining the focal point position control range, based on the number of imaging points and the focal point shift which is a function of coordinates (x, y) of each imaging point, and determines the focal point position control range based on the offset value, the focal point measure distribution width, and the focal point position shift.

11. The method according to claim 10, wherein
the computer system calculates the offset value according to the following Formula 3, and determines the focal point position control range according to the following Formula 4:

$$\text{offset} = dD_f/dn \times n + dD_f/dx \times x + dD_f/dy \times y \quad \text{(Formula 3)}$$

$$\text{range} = (\text{AVE}(W_{fm}(\alpha_s)) + 3 \times \text{SGM}(W_{fm}(\alpha_s)) + 6 \times \text{SGM}(D_f - \text{offset}))/\text{step} \quad \text{(Formula 4)}$$

where offset represents the offset value, $D_f$ represents the focal point position shift, range represents the focal point position control range, $W_{fm}(\alpha_s)$ represents the focal point measure distribution width represented by the following Formula 2, SGM represents standard deviation, and step represents a preset focal point search step width.

$$W_{fm}(\alpha) = \text{WIDTH}(fm(f), (\text{MAX}(fm) - \text{MIN}(fm)) \times \alpha + \text{MIN}(fm)) \quad \text{(Formula 2)}$$

where, WIDTH(x, y) represents a plot width at a height y of a function x, fm represents the focal point measure, MAX(fm) represents a maximum value of fm, MIN(fm) represents a minimum value of fm, and α represents a coefficient.

12. The method according to claim 11, further comprising:
a step of causing the computer system to generate a setting screen that allows selection of an element to be considered as the offset value among the number of imaging points, an x-coordinate of the imaging point, and a y-coordinate of the imaging point, and displaying the setting screen on a display screen of a display unit; and
a step of causing the computer system to calculate the offset value based on a selection content input from the setting screen.

13. A non-transitory storage medium recording a program, in a computer system, for being caused to determine a range for automatically searching for a focal point position in a charged particle beam device, wherein
the program is configured to cause the computer system to execute:
a process of calculating a focal point measure by digitizing a focus condition of a predetermined focal point position with respect to a sample;
a process of determining a focal point measure distribution width based on focal point position dependency of the focal point measure;
a process of calculating a focal point position shift based on focal point positions obtained before and after executing automatic search for a focused focal point position;
a process of determining a focal point position control range for the automatic search of the focused focal point position based on the focal point measure distribution width and the focal point position shift; and
a process of calculating the focused focal point position within the focal point position control range.

\* \* \* \* \*